United States Patent
Hatanpää et al.

(10) Patent No.: US 12,104,250 B2
(45) Date of Patent: Oct. 1, 2024

(54) VAPOR DEPOSITION PROCESSES

(71) Applicant: ASM IP Holding, B.V., Almere (NL)

(72) Inventors: Timo Hatanpää, Espoo (FI); Anton Vihervaara, Helsinki (FI); Mikko Ritala, Espoo (FI)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/822,576

(22) Filed: Aug. 26, 2022

(65) Prior Publication Data

US 2023/0064120 A1   Mar. 2, 2023

Related U.S. Application Data

(60) Provisional application No. 63/238,941, filed on Aug. 31, 2021.

(51) Int. Cl.
*C23C 16/455* (2006.01)
*C23C 16/08* (2006.01)

(52) U.S. Cl.
CPC ........ *C23C 16/45553* (2013.01); *C23C 16/08* (2013.01); *C23C 16/45527* (2013.01)

(58) Field of Classification Search
CPC .............. C23C 16/45553; C23C 16/08; C23C 16/45527; C07F 7/30
See application file for complete search history.

(56) References Cited

FOREIGN PATENT DOCUMENTS

WO   WO-2014210512 A1 * 12/2014 ........... C01B 33/021

OTHER PUBLICATIONS

Peterson ("The reactions of Substituted Germyl—and Silylhydrazines with BX3 and CY2 Acceptor Species", Peterson et al, Canadian Journal of Chemistry, 50, 562 (1972), 5 pages). (Year: 1972).*
Kaim, W., Organometall-stabilisierte 1,4-Dihydropyrazine: Extrem elektronenreiche Heterocyclen, Angew. Chem. 93 (1981) Nr. 6/7, 621-622.
Kaim, W., Zur "Antiaromatizität" von 1,4-Dihydropyrazinen, Angew. Chem. 93 (1981) Nr. 6/7, 620-621.
(Continued)

*Primary Examiner* — Michael G Miller
(74) *Attorney, Agent, or Firm* — Banner & Witcoff, Ltd.

(57) ABSTRACT

The present disclosure relates to methods for depositing an elemental metal or semimetal-containing material on a substrate by a cyclic deposition process, to an elemental metal or semimetal-containing layer, to a semiconductor structure and a device, and to deposition assemblies for depositing elemental metal or semimetal-containing material on a substrate. A method according to the current disclosure comprises providing a substrate in a reaction chamber, providing a metal or a semimetal precursor to the reaction chamber in a vapor phase, and providing a reducing agent into the reaction chamber in a vapor phase to form elemental metal or semimetal-containing material on the substrate. The reducing agent according to the method comprises a cyclohexadiene compound selected from compounds comprising a germanium-containing substituent.

19 Claims, 3 Drawing Sheets

(56) References Cited

OTHER PUBLICATIONS

Ariyasena, Thiloka Chandima, "(i)chromatographic Methods For Solute Descriptor Determinations (ii)ruthenium Substrate-Catalyzed Growth Of Nickel Nitride Thin Films By Atomic Layer Deposition" (2015), Wayne State University Dissertations. Paper 1114.

Kwan-Woo Do et al, Formation of Low-Resistivity Nickel Silicide with High Temperature Stability from Atomic-Layer-Deposited Nickel Thin Film, 2006 Jpn. J. Appl. Phys. 45, 2975.

Elko-Hansen, T. et al., XPS Investigation of the Atomic Layer Deposition Half Reactions of Bis(N-tert-butyl-N?-ethylpropionamidinato) Cobalt(II), Chem. Mater. 2014, 26, 8, 2642-2646.

Elko-Hansen, T. et al., (Invited) Selective Atomic Layer Deposition of Cobalt for Back End of Line, 2017 ECS Trans. 80, 29-37.

Frey G, et al. , Titanium-catalyzed reductive umpolung reactions with a metal-free terminal reducing agent. Chemistry. Apr. 7, 2015;21(15):5693-6.

Hausen, H. et al., Zur strukturellen flexibilität der "antiaromatischen" 1,4- dihydropyrazine. Kristall- und molekülstrukturen metallorganischer derivate, J. Organometallic Chemistry 296 (3) 1985, 321-337.

Kalutarage, L. et al., Volatile and thermally stable mid to late transition metal complexes containing ?-imino alkoxide ligands, a new strongly reducing coreagent, and thermal atomic layer deposition of Ni, Co, Fe, and Cr metal films, J Am Chem Soc. Aug. 28, 2013;135(34):12588-91.

Hee-Sung Kang, et al., Effect of catalyst for nickel films for NiSi formation with improved interface roughness, Thin Solid Films, vol. 519, Issue 20, 2011, pp. 6658-6661.

Kerrigan, M., et al., Low Temperature, Selective Atomic Layer Deposition of Nickel Metal Thin Films, ACS Appl. Mater. Interfaces 2018, 10, 14200?14208.

Kerrigan, M. et al., Low Temperature, Selective Atomic Layer Deposition of Cobalt Metal Films Using Bis(1,4-di-tert-butyl-1,3-diazadienyl)cobalt and Alkylamine Precursors, Chem. Mater. 2017, 29, 17, 7458-7466.

Kerrigan, M. et al., Substrate selectivity in the low temperature atomic layer deposition of cobalt metal films from bis (1,4-di-tert-butyl-1,3-diazadienyl)cobalt and formic acid, J. Chem Phys. Feb. 7, 2017;146(5):052813.

Kim, H., et al., Atomic layer deposition for nanoscale contact applications, 2011 IEEE International Interconnect Technology Conference, 2011, pp. 1-3. doi: 10.1109/IITC.2011.5940260.

Kim, W. et al., Atomic Layer Deposition of Ni Thin Films and Application to Area-Selective Deposition, 2011, J. Electrochem. Soc. 158(1), D1-D5.

Klesko, J. et al., Low Temperature Thermal Atomic Layer Deposition of Cobalt Metal Films, Chem. Mater. 2016, 28, 3, 700-703.

Kwon, J. et al., Substrate Selectivity of (tBu-Allyl)Co(CO)3 during Thermal Atomic Layer Deposition of Cobalt, Chem. Mater. 2012, 24, 6, 1025-1030.

Laguerre, M., et al., Silylation d'hydrocarbures mono-aromatiques mono- ou disubstitues, J. Organometallic Chemistry 112 (1) 1976, 49-59.

Lee et al., Degradation of the Deposition Blocking Layer During Area-Selective Plasma-Enhanced Atomic Layer Deposition of Cobalt, J. Korean Physical Society, 56(1), 2010, 104-107.

Lee et al., High Quality Area-Selective Atomic Layer Deposition Co Using Ammonia Gas as a Reactant, 2010 J. Electrochem. Soc. 157(1), D10-D15.

Lee et al., Silicidation of Co/Si Core Shell Nanowires, 2012 J. Electrochem. Soc. 159(5) K146-K151.

Lim, B. et al., Atomic layer deposition of transition metals, 2003, Nature Mater 2, 749-754.

Lim, B. et al., Synthesis and Characterization of Volatile, Thermally Stable, Reactive Transition Metal Amidinates, Inorg. Chem. 2003, 42(24), 7951-7958.

Thomas Joseph Knisley, New precursors and chemistry for the growth of transition metal films by atomic layer deposition, (2012) Wayne State University Dissertations. Paper 571.

Ryu, S. et al., Atomic layer deposition of 1D and 2D nickel nanostructures on graphite, Nanotechnology, Mar. 17, 2017;28(11):115301 (8pp).

Sarr, M. et al., Tailoring the Properties of Atomic Layer Deposited Nickel and Nickel Carbide Thin Films via Chain-Length Control of the Alcohol Reducing Agents, J. Phys. Chem. C, 2014, 118(40), 23385-23392.

Stevens, E. et al., Thermal atomic layer deposition of Sn metal using SnCl4 and a vapor phase silyl dihydropyrazine reducing agent, J. Vac. Sci. Technol. A, 36(6), Nov./Dec. 2018, 06A106-10.

Utriainen, M. et al., Studies of metallic thin film growth in an atomic layer epitaxy reactor using M(acac)2 (M=Ni, Cu, Pt) precursors, Applied Surface Science, 157(3) 2000, 151-158.

Weyenberg, D. et al., The Synthesis of 3,6-Disilyl-1,4-Cyclohexadienes by the Trapping of Benzene Anion-Radicals, J. Am. Chem. Soc., 1962, 84, pp. 2843-2844.

Zhang, Y. et al., High growth per cycle thermal atomic layer deposition of Ni films using an electron-rich precursor, Nanoscale, 2019, 11(8), 3484-3488.

* cited by examiner

VAPOR DEPOSITION PROCESSES

FIELD

The present disclosure relates to methods and apparatuses for the manufacture of semiconductor devices. More particularly, the disclosure relates to methods and apparatuses for depositing metal or semimetal on a substrate, and layers comprising a metal or a semimetal.

BACKGROUND

Semiconductor device manufacturing for advanced technology nodes requires high-quality thin films deposited uniformly over large areas and on complex 3D structures. Cyclical deposition processes may be used for the deposition of metal and semimetal materials. However, reducing agents suitable for the cyclical deposition of such materials, especially in low deposition temperatures, are uncommon and cost prohibitive.

Within vapor deposition technologies, thermal processes are sought after, as plasma may damage the underlying substrate material or compromise the conformality of the process. However, the deposition of metals and semimetals by ALD is hampered by the lack of efficient reducing agents to combine with suitable precursors. The most commonly used reducing agents, such as $H_2$ and $NH_3$ typically require deposition temperatures over 200° C. to sufficient reactivity. Other reducing agents may have drawbacks related to corrosiveness or inclusion of unwanted elements in the deposited material.

Thus, there is need in the art for new reducing agents for depositing metal and semimetal materials in low temperatures.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of depositing elemental metal or semimetal-containing material on a substrate, to an elemental metal or semimetal-containing layer, to a semiconductor structure and a device, and to deposition assemblies for depositing elemental metal or semimetal-containing material on a substrate.

In one aspect, a method of depositing elemental metal or semimetal-containing material on a substrate by a cyclic deposition process is disclosed. The method comprises providing a substrate in a reaction chamber, providing a metal or a semimetal precursor to the reaction chamber in a vapor phase, and providing a reducing agent into the reaction chamber in a vapor phase to form elemental metal or semimetal-containing material on the substrate. The reducing agent according to the method comprises a cyclohexadiene compound selected from compounds of formula (I).

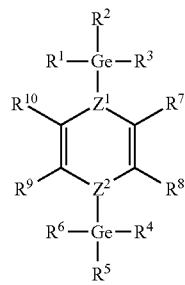

In the formula (I), each of $Z^1$ and $Z^2$ is independently selected from $CR^{11}$ and N, each of $R^1$ to $R^{11}$, is independently H, C1 to C7 linear or branched alkyl, C6 to C10 aryl or C6 to C14 heteroaryl. In some embodiments, $R^{11}$ is H. In some embodiments, each of $R^7$ to $R^{10}$ is independently selected from a group consisting of H, C1 to C4 linear and branched alkyls and phenyl. In some embodiments, all of R7 to R10 are H.

However, in some aspects, the reducing agent comprises a two-ringed bis(trialkylgermyl) molecule. For example, two molecules according to formula (I) may be fused through their $Z^1$ and/or $Z^2$ positions. In such molecules, each of the bonding $Z^1$ or $Z^2$ is $CR^{11}$, and the bond between the rings is formed in place of R11. In some embodiments, the reducing agent comprises 4,4'-bis(trialkylgermyl)-1,1',4,4'-tetrahydro-4,4'-bipyridine, such as 4,4'-bis(trimethylgermyl)-1,1',4,4'-tetrahydro-4,4'-bipyridine.

In some embodiments, each of R1 to R6 is independently selected from a group consisting of H, methyl, ethyl, n-propyl and isopropyl. In some embodiments, all of R1 to R6 are methyl or ethyl. In some embodiments, all of R1 to R6 are methyl. In some embodiments, the cyclohexadiene compound is 1,4-bis(trialkylgermyl)-1,4-dihydropyrazine. In some embodiments, the cyclohexadiene compound is 1,4-bis(trimethylgermyl)-1,4-dihydropyrazine. In some embodiments, the metal or semimetal precursor is a metal precursor and elemental metal is deposited on the substrate. In some embodiments, the metal or semimetal precursor is a transition metal precursor and elemental transition metal is deposited on the substrate. In some embodiments, the transition metal is a row 4 transition metal. In some embodiments, the row 4 transition metal is selected from Co, Ni, Cu and Zn. In some embodiments, the transition metal is a group 11 transition metal. In some embodiments, the transition metal is a noble metal. In some embodiments, the noble metal is selected from a group consisting of silver and gold. In some embodiments, the noble metal is gold. In some embodiments, the metal precursor comprises a metal halide. In some embodiments, the metal halide is selected from a group consisting of $CoCl_2$, $NiCl_2$, $CuCl_2$, $ZnCl_2$, $AuCl$, $CoBr_2$, $NiBr_2$, $CuBr_2$, $ZnBr_2$, $AuBr$, $CoI_2$, $NiI_2$, $CuI_2$, $ZnI_2$ and $AuI$. In some embodiments, the transition metal of the transition metal halide compound is a noble metal. In some embodiments, the metal precursor comprises an adduct ligand. In some embodiments, the adduct ligand is a monodentate adduct ligand. In some embodiments, the metal or semimetal precursor comprises a metal or semimetal atom in a formal oxidation state of +1, +2, +3 or +4.

In an aspect, a method of depositing a metal layer on a substrate is disclosed. The method comprises contacting the substrate with a vapor-phase metal precursor, wherein the metal precursor comprises a metal atom with an oxidation state of +1 or higher, and contacting the substrate with a vapor-phase reducing agent to reduce the metal atom in the metal precursor to form a metal layer on the substrate. In the method, the reducing agent comprises a cyclohexadiene compound selected from compounds of formula (I),

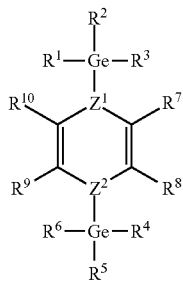

(I)

wherein each of $Z^1$ and $Z^2$ is independently selected from $CR^{11}$ and N, each of $R^1$ to $R^{11}$, is independently H, C1 to C7 linear or branched alkyl, C6 to C10 aryl or C6 to C14 heteroaryl.

In yet another aspect, a metal or semimetal layer produced by a cyclic deposition method is disclosed. The method comprises providing a substrate in a reaction chamber, providing a metal or a semimetal precursor to the reaction chamber in a vapor phase and providing a reducing agent into the reaction chamber in a vapor phase to form elemental metal or semimetal-containing material on the substrate. The reducing agent comprises a cyclohexadiene compound selected from compounds of formula (I),

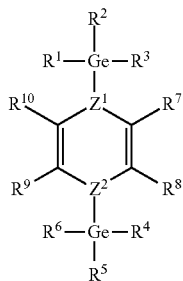

(I)

wherein each of $Z^1$ and $Z^2$ is independently selected from $CR^{11}$ and N, each of $R^1$ to $R^{11}$, is independently H, C1 to C7 linear or branched alkyl, C6 to C10 aryl or C6 to C14 heteroaryl.

In a further aspect, a semiconductor structure comprising elemental metal or semimetal deposited by a cyclic deposition method is disclosed. The method comprises providing a substrate in a reaction chamber, providing a metal or a semimetal precursor to the reaction chamber in a vapor phase, and providing a reducing agent into the reaction chamber in a vapor phase to form elemental metal or semimetal-containing material on the substrate. The reducing agent used to deposit elemental metal or semimetal comprises a cyclohexadiene compound selected from compounds of formula (I),

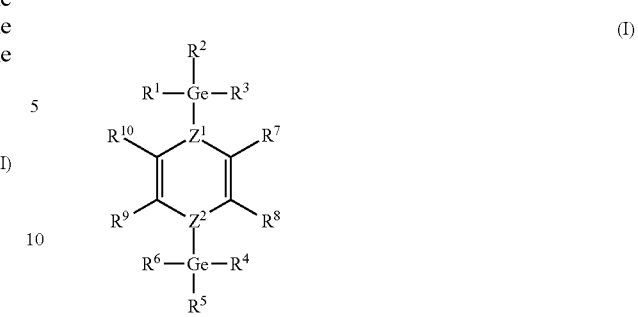

(I)

wherein each of $Z^1$ and $Z^2$ is independently selected from $CR^{11}$ and N, each of R1 to R11, is independently H, C1 to C7 linear or branched alkyl, C6 to C10 aryl or C6 to C14 heteroaryl.

In an additional aspect, a semiconductor device comprising elemental metal or semimetal deposited by a cyclic deposition method is disclosed. The method comprises providing a substrate in a reaction chamber, providing a metal or a semimetal precursor to the reaction chamber in a vapor phase, and providing a reducing agent into the reaction chamber in a vapor phase to form elemental metal or semimetal-containing material on the substrate. The reducing agent in depositing the elemental metal or semimetal comprises a cyclohexadiene compound selected from compounds of formula (I),

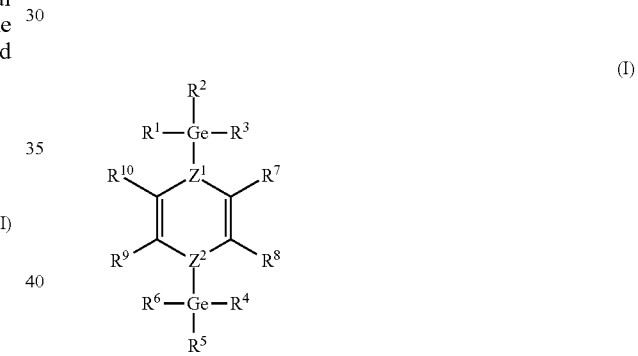

(I)

wherein each of $Z^1$ and $Z^2$ is independently selected from $CR^{11}$ and N, each of $R^1$ to $R^{11}$, is independently H, C1 to C7 linear or branched alkyl, C6 to C10 aryl or C6 to C14 heteroaryl.

In another aspect, a reducing agent for use in a vapor deposition process comprising an effective amount of a cyclohexadiene compound according to formula (I) is disclosed.

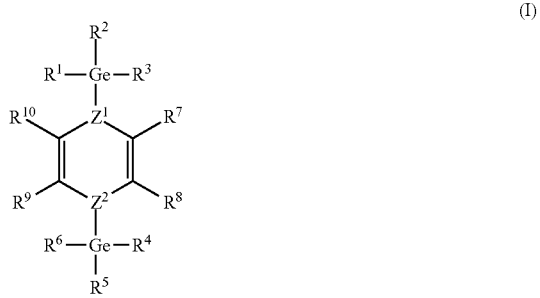

(I)

In the cyclohexadiene compound of the reducing agent, each of $Z^1$ and $Z^2$ is independently selected from $CR^{11}$ and N, each of $R^1$ to $R^{11}$, is independently H, C1 to C7 linear or branched alkyl, C6 to C10 aryl or C6 to C14 heteroaryl. In an embodiment of the reducing agent according to the current disclosure, the $R^{11}$ is H, all of $R^1$ to $R^6$ are methyl or ethyl, and all of $R^7$ to $R^{10}$ are H, methyl, ethyl, propyl or isopropyl.

In a yet further aspect, a deposition assembly for depositing elemental metal or semimetal on a substrate is disclosed. The deposition assembly comprises one or more reaction chambers constructed and arranged to hold the substrate and a precursor injector system constructed and arranged to provide a metal or semimetal precursor and a reducing agent into the reaction chamber in a vapor phase. The deposition assembly also comprises a precursor vessel constructed and arranged to contain a metal or semimetal precursor, and the assembly is constructed and arranged to provide the metal or semimetal precursor and the reducing agent via the precursor injector system to the reaction chamber to deposit metal or semimetal-containing material on the substrate.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings FIG. 1, panels A to C, is a block diagram of exemplary embodiments of a method according to the current disclosure.

DETAILED DESCRIPTION

Figure 1A:
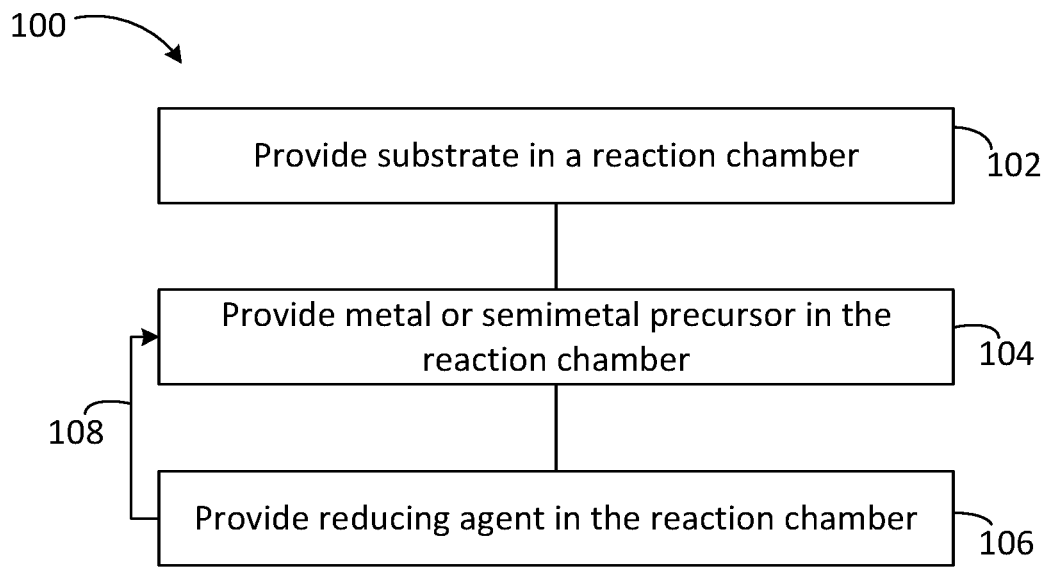

The description of exemplary embodiments of methods, layers, structures, devices and deposition assemblies provided below is merely exemplary and is intended for purposes of illustration only. The following description is not intended to limit the scope of the disclosure or the claims. Moreover, recitation of multiple embodiments having indicated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other. The headings provided herein, if any, are for convenience only and do not necessarily affect the scope or meaning of the claimed invention.

General Process

In the deposition methods according to the current disclosure, elemental metal or semimetal-containing material is deposited. Thus, the material deposited according to the current disclosure comprises elemental metal or elemental semimetal, or both. By elemental metal or semimetal is herein meant metal or semimetal with an oxidation state of zero. A metal or semimetal deposited according to the current disclosure may comprise elemental metal or semimetal and other forms of the metal or semimetal. For example, the metal or semimetal deposited according to the current disclosure may have an oxidation state of 0, +1, +2, +3, +4, +5 and/or +6, as may be characteristic to the element in question. In some embodiments, the material deposited according to the current disclosure consists essentially of, or consist of elemental metal. In some embodiments, the material deposited according to the current disclosure consists essentially of, or consist of elemental semimetal. In some embodiments, the deposited metal or semimetal is at least to some extent oxidized. In some embodiments, at least 60% of metal or semimetal is deposited as elemental metal or semimetal. In some embodiments, at least 80% or at least 90% of metal or semimetal is deposited as elemental metal or semimetal. In some embodiments, at least 93% or 95% of metal or semimetal is deposited as elemental metal or semimetal.

The elemental composition of material deposited according to the current disclosure may vary, depending on the process. In some embodiments, the material deposited according to the current disclosure comprises at least one more element in addition to the target metal or semimetal. Such materials may have different properties than metals that are useful in some applications. In some embodiments, the material may comprise two or more metals or semimetals. In such embodiments, at least one of the metals or semimetals is deposited according to the methods of the current disclosure. In some embodiments, a metal or semimetal-containing material may comprise, for example, at least about 60 atomic percentage (at. %) of the target metal or semimetal, or at least about 75 at. % of the target metal or semimetal, or about 75 to about 95 at. % of the target metal or semimetal, or about 75 to about 89 at. % of the target metal or semimetal. A metal or semimetal-containing material deposited by a method according to the current disclosure may comprise, for example at least about 80 at. %, about 85 at. %, about 87 at. %, about 90 at. %, about 95 at. %, about 97 at. % or about 99 at. % of the target metal or semimetal. In some embodiments, a metal or semimetal-containing material may consist essentially of, or consist of the target metal or semimetal. Material consisting of metal or semimetal may include an acceptable amount of impurities, such as oxygen, carbon, chlorine or other halogen, and/or hydrogen that may originate from one or more precursors used to deposit the metal or semimetal-containing material.

In some embodiments, the metal or semimetal-containing material may comprise less than about 30 at. %, less than about 20 at. %, less than about 10 at. %, less than about 8 at. %, less than about 7 at. %, less than about 5 at. %, or less than about 2 at. % oxygen. In some embodiments, the metal or semimetal-containing material may comprise less than about 20 at. %, less than about 15 at. %, less than about 10 at. %, less than about 8 at. %, less than about 6 at. %, less than about 5 at. %, less than 4.5 at. %, or less than about 3 at. % carbon.

In some embodiments, the elemental metal or semimetal-containing material may form a layer. In such embodiments, metal or semimetal forms a metal or semimetal layer. As used herein, a "metal or semimetal layer" can be a material layer that contains metal or semimetal. As used herein, the term "layer" and/or "film" can refer to any continuous or non-continuous structure and material, such as material deposited by the methods disclosed herein. For example, layer and/or film can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. A seed layer may be a non-continuous layer serving to increase the rate of nucleation of another material. However, the seed layer may also be substantially or completely continuous.

Substrate

As used herein, the term "substrate" may refer to any underlying material or materials that may be used to form, or upon which, a device, a circuit, material or a material layer may be formed. A substrate can include a bulk material, such as silicon (such as single-crystal silicon), other Group IV materials, such as germanium, or other semiconductor materials, such as a Group II-VI or Group III-V semiconductor materials. A substrate can include one or more layers overlying the bulk material. The substrate can include various topologies, such as gaps, including recesses, lines, trenches or spaces between elevated portions, such as fins, and the like formed within or on at least a portion of a layer of the substrate. Substrate may include nitrides, for example TiN, oxides, insulating materials, dielectric materials, conductive materials, metals, such as such as tungsten, ruthenium, molybdenum, cobalt, aluminum or copper, or metallic materials, crystalline materials, epitaxial, heteroepitaxial, and/or single crystal materials. In some embodiments of the current disclosure, the substrate comprises silicon. The substrate may comprise other materials, as described above, in addition to silicon. The other materials may form layers.

Vapor Deposition Process

The current disclosure relates to deposition of materials from a vapor phase. Thus, gaseous metal or semimetal precursor and reducing agent are used in the methods according to the current disclosure.

In this disclosure, "gas" can include material that is a gas at normal temperature and pressure (NTP), a vaporized solid and/or a vaporized liquid, and can be constituted by a single gas or a mixture of gases, depending on the context. A metal or semimetal precursor may be provided to the reaction chamber in gas phase. A reducing agent may be provided to the reaction chamber in gas phase. The term "inert gas" can refer to a gas that does not take part in a chemical reaction and/or does not become a part of a layer to an appreciable extent. Exemplary inert gases include He and Ar and any combination thereof. In some cases, molecular nitrogen and/or hydrogen can be an inert gas. A gas other than a process gas, i.e., a gas introduced without passing through a precursor injector system, other gas distribution device, or the like, can be used for, e.g., sealing the reaction space, and can include a seal gas.

In the current disclosure, the deposition process may comprise a cyclic deposition process, such as an atomic layer deposition (ALD) process or a cyclic chemical vapor deposition (VCD) process. The term "cyclic deposition process" can refer to the sequential introduction of precursor(s) and/or reactant(s) into a reaction chamber to deposit material, such as a metal or semimetal-containing material, on a substrate. Cyclic deposition includes processing techniques such as atomic layer deposition (ALD), cyclic chemical vapor deposition (cyclic CVD), and hybrid cyclic deposition processes that include an ALD component and a cyclic CVD component. The process may comprise a purge step between providing precursors or between providing a precursor and a reactant in the reaction chamber.

The process may comprise one or more cyclic phases. For example, pulsing of a metal or semimetal precursor and reducing agent may be repeated. In some embodiments, the process comprises or one or more acyclic phases. In some embodiments, the deposition process comprises the continuous flow of at least one precursor. In some embodiments, a reactant may be continuously provided in the reaction chamber. In such an embodiment, the process comprises a continuous flow of a precursor or a reactant. In some embodiments, one or more of the precursors and/or reactants are provided in the reaction chamber continuously. In some embodiments, auxiliary reactant may be provided in the reaction chamber continuously.

The term "atomic layer deposition" (ALD) can refer to a vapor deposition process in which deposition cycles, such as a plurality of consecutive deposition cycles, are conducted in a reaction chamber. Generally, for ALD processes, during each cycle, a precursor is introduced to a reaction chamber and is chemisorbed to a deposition surface (e.g., a substrate surface that may include a previously deposited material from a previous ALD cycle or other material), forming about a monolayer or sub-monolayer of material that does not readily react with additional precursor (i.e., a self-limiting reaction). Thereafter, in some cases, another precursor or a reactant may subsequently be introduced into the process chamber for use in converting the chemisorbed precursor to the desired material on the deposition surface. The second precursor or a reactant can be capable of further reaction with the precursor. Purging steps may be utilized during one or more cycles, e.g., during each step of each cycle, to remove any excess precursor from the process chamber and/or remove any excess reactant and/or reaction byproducts from the reaction chamber. Thus, in some embodiments, the cyclic deposition process comprises purging the reaction chamber after providing a metal or semimetal precursor into the reaction chamber. In some embodiments, the cyclic deposition process comprises purging the reaction chamber after providing a reducing agent into the reaction chamber. In some embodiments, the cyclic deposition process comprises purging the reaction chamber after providing any precursor or reactant into the reaction chamber.

CVD type processes typically involve gas phase reactions between two or more precursors and/or reactants. The precursor(s) and reactant(s) can be provided simultaneously to the reaction space or substrate, or in partially or completely separated pulses. The substrate and/or reaction space can be heated to promote the reaction between the gaseous precursor and/or reactants. In some embodiments the precursor(s) and reactant(s) are provided until a layer having a desired thickness is deposited. In some embodiments, cyclic CVD processes can be used with multiple cycles to deposit a thin film having a desired thickness. In cyclic CVD processes, the precursors and/or reactants may be provided to the reaction chamber in pulses that do not overlap, or that partially or completely overlap.

Without limiting the current disclosure to any specific theory, in some embodiments it may be possible to produce layers with low resistivity, especially when elemental metal is deposited. The resistivity of a metal layer according to the current disclosure may be less than 300 µOhm cm or less than 100 µΩ cm or less than 50 µΩ cm. For example, the resistivity of a metal layer according to the current disclosure may be from about 5 µΩ cm to about 300 µΩ cm, or from about 5 µΩ cm to about 100 µΩ cm, or from about 5 µΩ cm to about 50 µΩ cm, such as about 10 µΩ cm, 15 µΩ cm, 30 µΩ cm or 40 µΩ cm.

The metal or semimetal may be at least partly in elemental form after deposition. Thus, the oxidation state of metal or semimetal may be zero. In some embodiments, the metal or semimetal is substantially completely in elemental form after deposition. A metal or semimetal layer can include additional elements, such as nitrogen, carbon and/or oxygen. Other additional or alternative elements are possible. In some embodiments, the metal or semimetal layer may comprise significant proportions of other elements than the target metal or semimetal. However, in some embodiments, metal or semimetal layer may contain substantially only metal or semimetal. Thus, metal or semimetal layer may comprise, consist essentially of, or consist of metal or semimetal. In some embodiments, the metal or semimetal layer may be a seed layer. A seed layer may be used to enhance the deposition of another layer. In some embodiments, two or more metals or semimetals may be deposited by the methods disclosed herein. In such embodiments, the method may comprise providing at least two different metal or semimetal precursors into the reaction chamber.

In some embodiments, the reaction chamber is purged after providing a metal or semimetal precursor and/or a reducing agent therein. As used herein, the term "purge" may refer to a procedure in which vapor phase precursors and/or vapor phase byproducts are removed from the substrate surface for example by evacuating the reaction chamber with a vacuum pump and/or by replacing the gas inside a reaction chamber with an inert or substantially inert gas such as argon or nitrogen. Purging may be effected between two pulses of gases which react with each other. However, purging may be effected between two pulses of gases that do not react with each other. For example, a purge, or purging may be provided between pulses of two precursors or between a precursor and a reactant. Purging may avoid or at least reduce gas-phase interactions between the two gases reacting with each other. It shall be understood that a purge can be effected either in time or in space, or both. For example in the case of temporal purges, a purge step can be used e.g. in the temporal sequence of providing a first precursor to a reactor chamber, providing a purge gas to the reactor chamber, and providing a second precursor to the reactor chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied. Purging times may be, for example, from about 0.01 seconds to about 20 seconds, from about 0.05 s to about 20 s, or from about 1 s to about 20 s, or from about 0.5 s to about 10 s, or between about 1 s and about 7 seconds, such as 5 s, 6 s or 8 s. However, other purge times can be utilized if necessary, such as where highly conformal step coverage over extremely high aspect ratio structures or other structures with complex surface morphology is needed, or in specific reactor types, such as a batch reactor, may be used.

In some embodiments, the cyclic deposition process according to the current disclosure comprises a thermal deposition process. In thermal deposition, the chemical reactions are promoted by increased temperature relevant to ambient temperature. Generally, temperature increase provides the energy needed for the formation of elemental metal or semimetal-containing material in the absence of other external energy sources, such as plasma, radicals, or other forms of radiation. In some embodiments, the cyclic deposition process according to the current disclosure is a fully thermal process, i.e. it does not comprise plasma steps. However, in some embodiments, the method comprises at least one plasma-enhanced step. In some embodiments, the method according to the current disclosure is a plasma-enhanced deposition method, for example PEALD or PECVD.

The terms "precursor" and "reactant" can refer to molecules (compounds or molecules comprising a single element) that participate in a chemical reaction that produces another compound. A precursor typically contains portions that are at least partly incorporated into the compound or element resulting from the chemical reaction in question. Such a resulting compound or element may be deposited on a substrate. A reactant may me an element or a compound that is not incorporated into the resulting compound or element to a significant extent. However, a reactant may also contribute to the resulting compound or element in certain embodiments, or it may modify the properties of the deposited material.

As used herein, "a metal or semimetal precursor" includes a gas or a material that can become gaseous and that can be represented by a chemical formula that includes the target metal or semimetal. By a target metal or semimetal is meant the element that is intended to be deposited. Examples of target metals include transition metals, such as early transition metals, late transition metals, lanthanide series metals and post-transition metals. Examples of target semimetals include boron (B), silicon (Si), germanium (Ge), arsenic (As), antimony (Sb), bismuth (Bi) and tellurium (Te). In some embodiments, the semimetal precursor comprises In some embodiments, the metal precursor comprises a transition metal for depositing elemental transition metal on the substrate. In some embodiments, the transition metal precursor comprises a group 4 to 6 transition metal for depositing elemental group 4 to 6 transition metal on the substrate. In some embodiments, the transition metal precursor comprises a group 11 transition metal for depositing elemental group 11 transition metal on the substrate. In some embodiments, the metal precursor comprises a row 4 transition metal for depositing elemental row 4 transition metal on the substrate. In some embodiments, the row 4 transition metal is selected from a group consisting of cobalt (Co), nickel (Ni), copper (Cu) and zinc (Zn). In some embodiments, the transition metal in the transition metal precursor is selected from a group consisting of scandium (Sc), yttrium (Y), titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), zinc (Zn), cadmium (Cd). In some embodiments, the transition metal in the transition metal precursor is selected from a group consisting of Ti, Zr, Hf, V, Nb, Ta, Cr, Mo, W, Fe, Ru, Os, Co, Rh, Ir, Ni, Pd, Pt, Cu, Ag, Au, Zn, Cd. In some embodiments, the transition metal in the transition metal precursor is selected from a group consisting of Ti, Zr, Hf, V, Nb, Ta, Cr, Mo, W, Co, Rh, Ir, Ni, Cu, Zn. In some embodiments, the transition metal is selected from a group consisting of Sc, Ti, V, Cr, Mn, Fe, Co, Ni, Cu and Zn. In some embodiments, the metal precursor comprises a lanthanide group metal for depositing elemental lanthanide series metal on the substrate.

In some embodiments, the metal precursor is a metal organic precursor or an organometallic precursor. Many different classes of such precursors are used in the art of cyclic vapor deposition. The precursor should be gaseous in a suitable temperature and pressure to allow the deposition according to the current disclosure. The metal precursor may be, for example, a β-diketonate-, cyclopentadienyl-, carbonyl- or alkoxide-containing.

In some embodiments, the metal precursor comprises a metal atom with an oxidation state of +1. In some embodiments, the metal precursor comprises a metal atom with an oxidation state of +2. In some embodiments, the metal precursor comprises a metal atom with an oxidation state of +1 or +2. In some embodiments, the metal precursor comprises a metal atom with an oxidation state of +2 or higher, such as +3, +4, +5 or +6. In some embodiments, the metal precursor comprises a metal halide. In some embodiments, the metal precursor comprises a metal halide and an adduct ligand. In some embodiments, the adduct ligand comprises a phosphine. In some embodiments, the adduct ligand comprises an amine. In some embodiments, the adduct ligand is a bidentate adduct ligand. In some embodiments, the adduct ligand is a monodentate adduct ligand.

In some embodiments, the metal precursor is a transition metal precursor for depositing transition metal-containing material on the substrate. In some embodiments, a transition metal precursor comprises a transition metal halide compound. In some embodiments, the transition metal in the transition metal halide compound is selected from a group consisting of manganese, iron, cobalt, nickel, copper and gold. In some embodiments, the transition metal is selected from a group consisting of Co, Ni and Cu.

In some embodiments, the transition metal precursor may comprise a transition metal compound with an adduct-forming ligand, such as monodentate, bidentate, or multidentate adduct-forming ligand. In some embodiments, the transition metal precursor may comprise a transition metal halide compound with adduct-forming ligand, such as monodentate, bidentate, or multidentate adduct-forming ligand. In some embodiments, the transition metal precursor may comprise a transition metal compound with adduct-forming ligand comprising nitrogen, such as monodentate, bidentate, or multidentate adduct-forming ligand comprising nitrogen. In some embodiments, the adduct-forming ligand comprises at least one of nitrogen, phosphorous, oxygen or sulfur.

In some embodiments of the disclosure, the adduct-forming ligand in the transition metal compound, such as a transition metal halide compound, may comprise a monodentate, bidentate, or multidentate adduct-forming ligand which coordinates to the transition metal atom, of the transition metal compound, through at least one of a nitrogen atom, a phosphorous atom, an oxygen atom, a carbon atom or a sulfur atom. In some embodiments of the disclosure, the adduct-forming ligand in the transition metal compound may comprise a cyclic adduct-forming ligand. In some embodiments of the disclosure, the adduct-forming ligand in the transition metal compound may comprise mono, di-, or polyamines. In some embodiments of the disclosure, the adduct-forming ligand in the transition metal compound may comprise mono-, di-, or polyethers. In some embodiments, the adduct-forming ligand in the transition metal compound may comprise mono-, di-, or polyphosphines. Phosphines may have advantages especially in embodiments, in which the transition metal comprises copper. In some embodiments, the adduct-forming ligand in the transition metal compound may comprise carbon and/or in addition to the nitrogen, oxygen, phosphorous, or sulfur in the adduct-forming ligand.

In some embodiments, the adduct-forming ligand in the transition metal compound may comprise one monodentate adduct-forming ligand. In some embodiments of the disclosure, the adduct-forming ligand in the transition metal compound may comprise two monodentate adduct-forming ligands. In some embodiments of the disclosure, the adduct-forming ligand in the transition metal compound may comprise three monodentate adduct-forming ligands. In some embodiments of the disclosure, the adduct-forming ligand in the transition metal compound may comprise four monodentate adduct-forming ligands. In some embodiments of the disclosure, the adduct-forming ligand in the transition metal compound may comprise one bidentate adduct-forming ligand. In some embodiments of the disclosure, the adduct-forming ligand in the transition metal compound may comprise two bidentate adduct-forming ligands. In some embodiments of the disclosure, the adduct-forming ligand in the transition metal compound may comprise one multidentate adduct-forming ligand. In some embodiments of the disclosure, the adduct-forming ligand in the transition metal compound may comprise two multidentate adduct-forming ligands.

In some embodiments, the transition metal halide compound comprises a transition metal bromide, a transition metal chloride, a transition metal iodide or a transition metal fluoride. Specifically, the transition metal halide compound may comprise at least one of a cobalt chloride, a nickel chloride, a copper chloride, gold chloride, cobalt bromide, a nickel bromide, a copper bromide, a gold bromide, cobalt iodide, a nickel iodide, a copper iodide or a gold iodide.

In some embodiments of the disclosure, the transition metal halide compound may comprise a transition metal species, including, but not limited to, at least one of manganese, iron, cobalt, nickel, copper and gold. In some embodiments of the disclosure, the transition metal halide compound may comprise at least one of a manganese chloride, an iron chloride, a cobalt chloride, a nickel chloride, a copper chloride and gold chloride. In some embodiments of the disclosure, the transition metal halide compound may comprise at least one of a manganese bromide, an iron bromide, a cobalt bromide, a nickel bromide, a copper bromide and gold bromide. In some embodiments of the disclosure, the transition metal halide compound may comprise at least one of a manganese fluoride, an iron fluoride, a cobalt fluoride, a nickel fluoride, a copper fluoride and gold fluoride. In some embodiments, the transition metal halide compound comprises a bidentate nitrogen-containing ligand. In some embodiments, the transition metal halide compound may comprise a bidentate nitrogen-containing adduct-forming ligand. In some embodiments, the transition metal halide compound may comprise an adduct-forming ligand including two nitrogen atoms, wherein each of the nitrogen atoms are bonded to at least one carbon atom. In some embodiments of the disclosure, the transition metal halide compound comprises one or more nitrogen atoms bonded to a central transition metal atom thereby forming a metal complex.

In some embodiments, the bidentate nitrogen containing adduct-forming ligand comprises two nitrogen atoms, each of nitrogen atoms bonded to at least one carbon atom.

In some embodiments of the disclosure, the transition metal precursor may comprise a transition metal compound having the formula (III):

$$(\text{adduct})_n\text{-M-X}_a \qquad (III)$$

wherein each of the "adducts" is an adduct-forming ligand and can be independently selected to be a mono-, a bi-, or a multidentate adduct-forming ligand or mixtures thereof: n is from 1 to 4 in case of monodentate forming ligand, n is from 1 to 2 in case of bi- or multidentate adduct-forming ligand; M is a transition metal, such as, for example, cobalt (Co), copper (Cu), or nickel (Ni); wherein each of $X_a$ is another ligand, and can be independently selected to be a halide or other ligand; wherein a is from 1 to 4, and some instances a is 2.

In some embodiments, the adduct-forming ligand comprises nitrogen, such as an amine, a diamine, or a polyamine adduct-forming ligand. In such embodiments, the transition metal compound may comprise at least one of, triethylamine (TEA), N,N,N',N'-tetramethyl-1,2-ethylenediamine (CAS: 110-18-9, TMEDA), N,N,N',N'-tetraethylethylenediamine (CAS: 150-77-6, TEEDA), N,N'-diethyl-1,2-ethylenediamine (CAS: 111-74-0, DEEDA), N,N'-diisopropylethylenediamine (CAS: 4013-94-9), N,N,N',N'-tetramethyl-1,3-propanediamine (CAS: 110-95-2, TMPDA), N,N,N',N'-tetramethylmethanediamine (CAS: 51-80-9, TMMDA), N,N,N',N'',N''-pentamethyldiethylenetriamine (CAS: 3030-47-5, PMDETA), diethylenetriamine (CAS: 111-40-0, DIEN), triethylenetetraamine (CAS: 112-24-3, TRIEN), tris (2-aminoethyl)amine (CAS: 4097-89-6, TREN, TAEA), 1,1,4,7,10,10-hexamethyltriethylenetetramine (CAS: 3083-10-1, HMTETA), 1,4,8,11-tetraazacyclotetradecane (CAS: 295-37-4, Cyclam), 1,4,7-Trimethyl-1,4,7-triazacyclononane (CAS: 96556-05-7), or 1,4,8,11-tetramethyl-1,4,8,11-tetraazacyclotetradecane (CAS: 41203-22-9). In some embodiments, the adduct-forming ligand comprises TMEDA or TMPDA.

In some embodiments, the transition metal halide compound may comprise cobalt chloride N,N,N',N'-tetramethyl-1,2-ethylenediamine (CoCl$_2$(TMEDA)). In some embodiments, the transition metal halide compound may comprise cobalt bromide tetramethylethylenediamine (CoBr$_2$(TMEDA)). In some embodiments, the transition metal halide compound may comprise cobalt iodide tetramethylethylenediamine (CoI$_2$(TMEDA)). In some embodiments, the transition metal halide compound may comprise cobalt chloride N,N,N',N'-tetramethyl-1,3-propanediamine (CoCl$_2$(TMPDA)). In some embodiments, the transition metal halide compound may comprise at least one of cobalt chloride N,N,N',N'-tetramethyl-1,2-ethylenediamine (CoCl$_2$(TMEDA)), nickel chloride tetramethyl-1,3-propanediamine (NiCl$_2$(TMPDA)), or nickel iodide tetramethyl-1,3-propanediamine (NiI$_2$(TMPDA)). In some embodiments, the transition metal compound or the transition metal halide compound comprises at least one of CoCl$_2$(TMEDA), CoBr$_2$(TMEDA), CoI$_2$(TMEDA), CoCl$_2$(TMPDA), or NiCl$_2$(TMPDA).

In some embodiments, the adduct-forming ligand comprises phosphorous, such as a phosphine, a diphosphine, or a polyphosphine adduct-forming ligand. For example, the transition metal compound may comprise at least one of triethylphosphine (CAS: 554-70-1), trimethyl phosphite (CAS: 121-45-9), 1,2-bis(diethylphosphino)ethane (CAS: 6411-21-8, BDEPE), 1,2-Bis(dimethylphosphino)ethane (CAS: 23936-60-9), 1,3-bis(diethylphosphino) propane (CAS: 29149-93-7) or 1,3-bis(dimethylphosphino)propane (CAS: 39564-18-6).

In some embodiments, the metal precursor is a transition metal precursor and comprises a transition metal halide compound comprising an organic phosphine adduct ligand. In some embodiments, the transition metal of the transition metal halide compound is a row 4 transition metal. In some embodiments, the transition metal may be selected from a group consisting of Sc, Ti, V, Cr, Mn, Fe, Co, Ni, Cu and Zn. In some embodiments, the transition metal is selected from a group consisting of Co, Ni and Cu. In some embodiments, the transition metal of the transition metal halide compound is a group 11 transition metal. In some embodiments, the transition metal may be selected from a group consisting of Cu, Ag and Au.

In some embodiments, the transition metal of the transition metal halide compound has an oxidation state of +2. In some embodiments, the transition metal of the transition metal halide compound has an oxidation state of +1. The halogen of the transition metal halide compound may be selected from a group consisting of fluorine (F), chlorine (Cl), bromine (Br) and iodine (I). In some embodiments, the halogen of the transition metal halide compound is selected from a group consisting of Cl and Br. In some embodiments, the transition metal halide is selected from a group consisting of CoCl$_2$, CoBr$_2$, NiCl$_2$, NiBr$_2$, CuCl$_2$, CuBr$_2$, AuCl, AuBr and AuI. In some embodiments, the transition metal halide is selected from a group consisting of NiCl$_2$ and NiBr$_2$. In some embodiments, the transition metal halide is AuCl.

The transition metal halide compound according to the current disclosure comprises an organic phosphine adduct ligand. An organic phosphine adduct ligand comprises a phosphorus (P) atom bonded to one or more organic ligands. In some embodiments, the phosphorus atom of the organic phosphine adduct ligand is bonded to at least one organic group. In some embodiments, the phosphorus atom of the organic phosphine adduct ligand is bonded to at least two organic groups. In some embodiments, the phosphorus atom of the organic phosphine adduct ligand is bonded to three organic groups. In some embodiments, the organic group is an alkyl group. In some embodiments, all of the organic groups bonded to the phosphorus atom are alkyl groups. In some embodiments, the alkyl groups are linear or branched alkyls. In some embodiments, the alkyl groups are not aromatic alkyl groups. In some embodiments, the alkyl groups are not cyclic alkyl groups.

In some embodiments, an alkyl group is a C1 to C4 alkyl. In some embodiments, an alkyl group is selected from methyl, ethyl, n-propyl and isopropyl. In some embodiments, the phosphine adduct ligand is trimethyl phosphine. In some embodiments, the phosphine adduct ligand is triethyl phosphine. In some embodiments, the phosphine adduct ligand is tri-n-propyl phosphine. In some embodiments, the phosphine adduct ligand is triisopropyl phosphine. In some embodiments, the transition metal halide compound comprises two organic phosphine adduct ligands. In some embodiments, all organic ligands, such as C1 to C4 alkyl ligands, in a phosphine adduct ligand are identical. In some embodiments, the two organic phosphine adduct ligands are identical.

In some embodiments, the transition metal halide compound has the formula (IV)

$$MX_y(PRR'R'')_z \qquad (IV),$$

wherein M is a transition metal selected from a group consisting of Ti, V, Cr, Mn, Fe, Co, Ni, Cu, Zn, Ag and Au; X is a halogen selected from F, Cl, Br and I; R, R' and R'' are each independently selected from C1 to C4 alkyls, y is an integer from 1 to 5, and z is an integer from 1 to 4. In some embodiments, y is 2 and z is 2. In some embodiments, y is 3 and z is 2. In some embodiments, y is 3 and z is 3. In some embodiments, at least one of R, R' and R" is trimethyl phosphine. In some embodiments, at least one of R, R' and R" is triethyl phosphine. In some embodiments, at least one of R, R' and R" is tri-n-propyl phosphine. In some embodiments, at least one of R, R' and R" is triisopropyl phosphine. In some embodiments, R' and R" are identical. In some embodiments, all of R, R' and R" are identical. In such embodiments, the transition metal halide compound may be represented by formula (V).

In some embodiments, the transition metal halide compound has the formula (Va)

$$MX_2(PR_3)_2 \qquad (Va),$$

wherein M is a transition metal selected from a group consisting of Ti, V, Cr, Mn, Fe, Co, Ni, Cu and Zn; X is a halogen selected from F, Cl, Br and I; R is a C1 to C4 alkyl. In some embodiments, M is selected from Ni, Cu and Co. In some embodiments, X is selected from Cl and Br. In some embodiments, R is selected from methyl and ethyl. In some embodiments, M is Ni, X is Cl and R is methyl. In some embodiments, M is Ni, X is Cl and R is ethyl. In some embodiments, M is Ni, X is Br and R is methyl. In some embodiments, M is Ni, X is Br and R is ethyl. In some embodiments, M is Cu, X is Cl and R is methyl. In some embodiments, M is Cu, X is Cl and R is ethyl. In some embodiments, M is Cu, X is Br and R is methyl. In some embodiments, M is Cu, X is Br and R is ethyl. In some embodiments, M is Co, X is Cl and R is methyl. In some embodiments, M is Co, X is Cl and R is ethyl. In some embodiments, M is Co, X is Br and R is methyl. In some embodiments, M is Co, X is Br and R is ethyl.

In some embodiments, the transition metal halide compound comprises, consists essentially of, or consists of dichloro-bis(trimethylphosphine)nickel. In some embodiments, the transition metal halide compound comprises, consists essentially of or consists of dichloro-bis(triethylphosphine)nickel. In some embodiments, the transition metal halide compound comprises, consists essentially of, or consists of dibromo-bis(trimethylphosphine)nickel. In some embodiments, the transition metal halide compound comprises, consists essentially of or consists of dibromo-bis(triethylphosphine)nickel. In some embodiments, the transition metal halide compound comprises, consists essentially of, or consists of dichloro-bis(trimethylphosphine)copper. In some embodiments, the transition metal halide compound comprises, consists essentially of or consists of dichloro-bis(triethylphosphine)copper. In some embodiments, the transition metal halide compound comprises, consists essentially of, or consists of dibromo-bis(trimethylphosphine)copper. In some embodiments, the transition metal halide compound comprises, consists essentially of or consists of dibromo-bis(triethylphosphine)copper. In some embodiments, the transition metal halide compound comprises, consists essentially of, or consists of dichloro-bis(trimethylphosphine)cobalt. In some embodiments, the transition metal halide compound comprises, consists essentially of or consists of dichloro-bis(triethylphosphine)cobalt. In some embodiments, the transition metal halide compound comprises, consists essentially of, or consists of dibromo-bis(trimethylphosphine)cobalt. In some embodiments, the transition metal halide compound comprises, consists essentially of or consists of dibromo-bis(triethylphosphine)cobalt.

In some embodiments, the transition metal halide compound has the formula (Vb)

$$MX(PR_3) \qquad (Vb),$$

wherein M is a transition metal selected from a group consisting of Co, Ag and Au; X is a halogen selected from F, Cl, Br and I; and R is a C1 to C4 alkyl. In some embodiments, M is Au. In some embodiments, X is selected from Cl, Br and I. In some embodiments, R is selected from methyl and ethyl. In some embodiments, M is Au, X is Cl and R is methyl. In some embodiments, M is Au, X is Cl and R is ethyl. In some embodiments, M is Au, X is Br and R is methyl. In some embodiments, M is Au, X is Br and R is ethyl. In some embodiments, M is Ni, X is I and R is methyl. In some embodiments, M is Au, X is I and R is ethyl. In some embodiments, M is Ag, X is Cl and R is methyl. In some embodiments, M is Ag, X is Cl and R is ethyl. In some embodiments, M is Ag, X is Br and R is methyl. In some embodiments, M is Ag, X is Br and R is ethyl. In some embodiments, M is Ag, X is I and R is methyl. In some embodiments, M is Ag, X is I and R is ethyl.

In some embodiments, a transition metal precursor is provided in a mixture of two or more compounds. In a mixture, the other compounds in addition to the transition metal precursor may be inert compounds or elements. In some embodiments, transition metal precursor is provided in a composition. Compositions suitable for use as composition can include a transition metal compound and an effective amount of one or more stabilizing agents. Composition may be a solution or a gas in standard conditions. In some embodiments, a mixture of at least two transition metals may be deposited. In such embodiments, the transition metal precursor may comprise two different transition metal-containing compounds, one or more of them being transition metal halide compounds according to the current disclosure.

In some embodiments of the disclosure, the adduct-forming ligand comprises oxygen, such as an ether, a diether, or a polyether adduct-forming ligand. For example, the transition metal compound may comprise at least one of, 1,4-dioxane (CAS: 123-91-1), 1,2-dimethoxyethane (CAS: 110-71-4, DME, monoglyme), diethylene glycol dimethyl ether (CAS: 111-96-6, diglyme), triethylene glycol dimethyl ether (CAS: 112-49-2, triglyme), or 1,4,7,10-tetraoxacyclododecane (CAS: 294-93-9, 12-Crown-4).

In some embodiments, the adduct-forming ligand may comprise a thioether, or mixed ether amine, such as, for example, at least one of 1,7-diaza-12-crown-4: 1,7-dioxa-4, 10-diazacyclododecane (CAS: 294-92-8), or 1,2-bis(methylthio)ethane (CAS: 6628-18-8).

In some embodiments, the metal or semimetal precursor is provided in a mixture of two or more compounds. In a mixture, the other compounds in addition to the metal or semimetal precursor may be inert compounds or elements. In some embodiments, metal or semimetal precursor is provided in a composition. Compositions suitable for use as composition can include a transition metal compound and an effective amount of one or more stabilizing agents. Composition may be a solution or a gas in standard conditions.

A reducing agent according to the current disclosures comprises cyclohexadiene compound comprising two germanium atoms attached to the ring. In some embodiments, the germanium atoms are directly bonded to the ring structure. In some embodiments, one or both of the germanium atoms are bonded to the ring structure through a nitrogen heteroatom substituting one of the carbon atoms in the ring. In some embodiments, the germanium atoms are bonded to adjacent positions of the ring (1,2 configuration). In some embodiments, the germanium atoms are bonded to opposite positions of the ring (1,4 configuration).

For simplicity of nomenclature, the term cyclohexadiene encompasses ring structures comprising only carbon, as well as ring structures comprising one or two nitrogen atoms. Thus, in addition to the germyl groups, the cyclohexadiene ring may have additional substituents. In some embodiments, one or more of the ring carbons have an alkyl substituent. The alkyl substituents may be linear or branched. In some embodiments, one ring carbon has a C1 to C7 alkyl substituent. In some embodiments, two ring carbons have a C1 to C7 alkyl substituent. In some embodiments, three ring carbons have a C1 to C7 alkyl substituent. In some embodiments, four ring carbons have a C1 to C7 alkyl substituent. If a germanium atom is attached to the cyclohexadiene ring through a carbon atom, the same carbon atom may have an additional alkyl substituent. In some embodiments, all the additional substituents to ring carbons are C1 to C4 alkyls. In some embodiments, all of the additional substituents are methyl or ethyl groups. In some embodiments, all of the additional substituents are methyl groups. In some embodiments, all of the additional substituents are ethyl groups. In some embodiments, the cyclohexadiene compound has one additional substituent, and the additional substituent is a methyl group. In some embodiments, the cyclohexadiene compound has one additional substituent, and the additional substituent is an ethyl group. In some embodiments, the methyl group is attached to a carbon adjacent to a germanium group-bonded carbon atom. In some embodiments, however, none of the ring carbons have additional substituents.

Increasing molecular weight of the cyclohexadiene compound generally adversely impacts its volatility. Thus, the more substituents the cyclohexadiene ring comprises, the smaller they need to be to retain sufficient volatility.

In some embodiments, the two germanium groups of the cyclohexadiene compound are trialkylgermanium groups. In some embodiments, the two trialkylgermanium groups comprise C1 to C7 alkyl groups. The alkyl groups may be linear or branched. In some embodiments, the two germanium groups of the cyclohexadiene compound are trimethylgermanium groups. In some embodiments, the two germanium groups of the cyclohexadiene compound are triethylgermanium groups.

In some embodiments, the cyclohexadiene compound according to the current disclosure has a structure according to formula (VI). In some embodiments, the cyclohexadiene compound according to the current disclosure has a structure according to formula (VII). In some embodiments, the cyclohexadiene compound according to the current disclosure has a structure according to formula (VIII). In some embodiments, the cyclohexadiene compound according to the current disclosure has a structure according to formula (IX). In some embodiments, the cyclohexadiene compound according to the current disclosure has a structure according to formula (X). In some embodiments, the cyclohexadiene compound according to the current disclosure has a structure according to formula (XII).

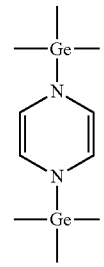

(VI)

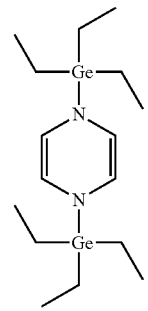

(VII)

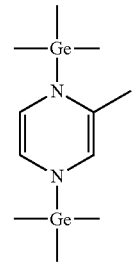

(VIII)

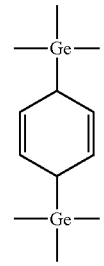

(IX)

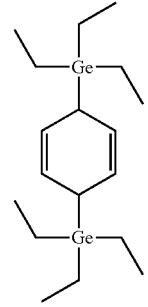

(X)

-continued

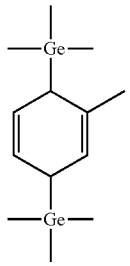

(XI)

In some aspects, the reducing agent comprises a two-ringed structure, in which two cylohexadiene rings are connected by a bond between the rings (i.e. the rings do not share ring atoms). For example, two-ringed bis(trialkylgermyl) molecules may be used. The two rings may be dihydropyridine rings. For example, two molecules according to formula (I) may be fused through their $Z^1$ and/or $Z^2$ positions. In such molecules, each of the bonding $Z^1$ or $Z^2$ is $CR^{11}$, and the bond between the rings is formed in place of R11. In some embodiments, the reducing agent comprises 4,4'-bis(trialkylgermyl)-1,1',4,4'-tetrahydro-4,4'-bipyridine, such as 4,4'-bis(trimethylgermyl)-1,1',4,4'-tetrahydro-4,4'-bipyridine.

DRAWINGS

The disclosure is further explained by the following exemplary embodiments depicted in the drawings. The illustrations presented herein are not meant to be actual views of any particular material, structure, device or an apparatus, but are merely schematic representations to describe embodiments of the current disclosure. It will be appreciated that elements in the figures are illustrated for simplicity and clarity and have not necessarily been drawn to scale. For example, the dimensions of some of the elements in the figures may be exaggerated relative to other elements to help improve the understanding of illustrated embodiments of the present disclosure. The structures and devices depicted in the drawings may contain additional elements and details, which may be omitted for clarity.

Figure 1B:
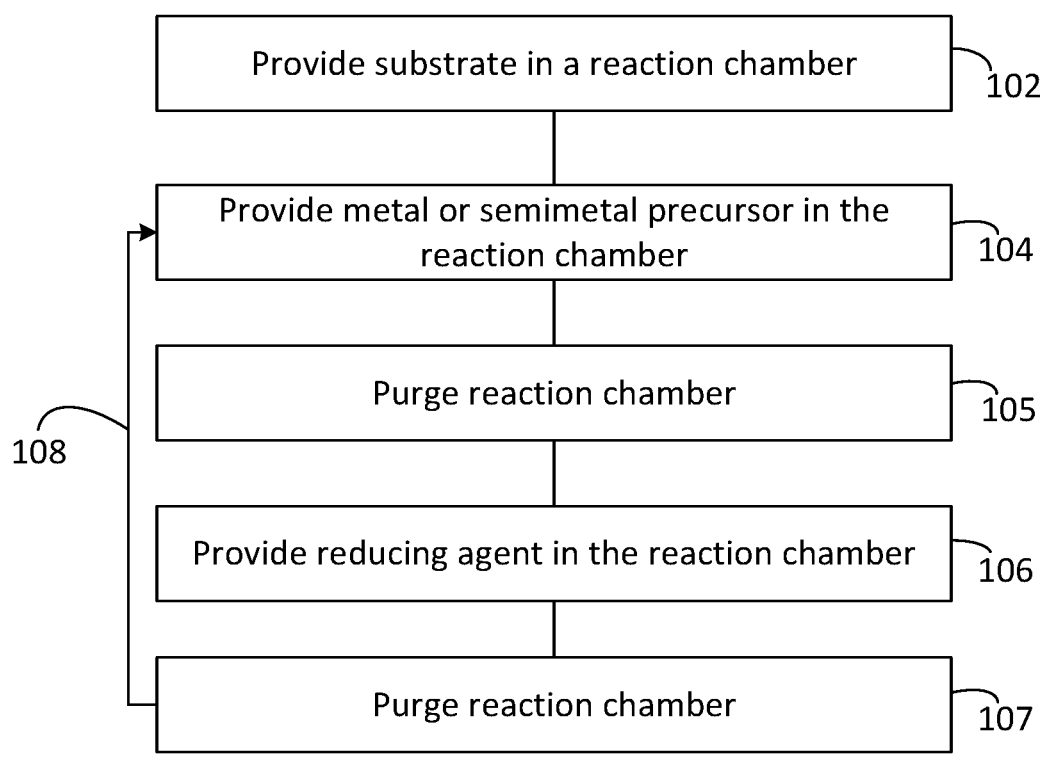
Figure 1C:
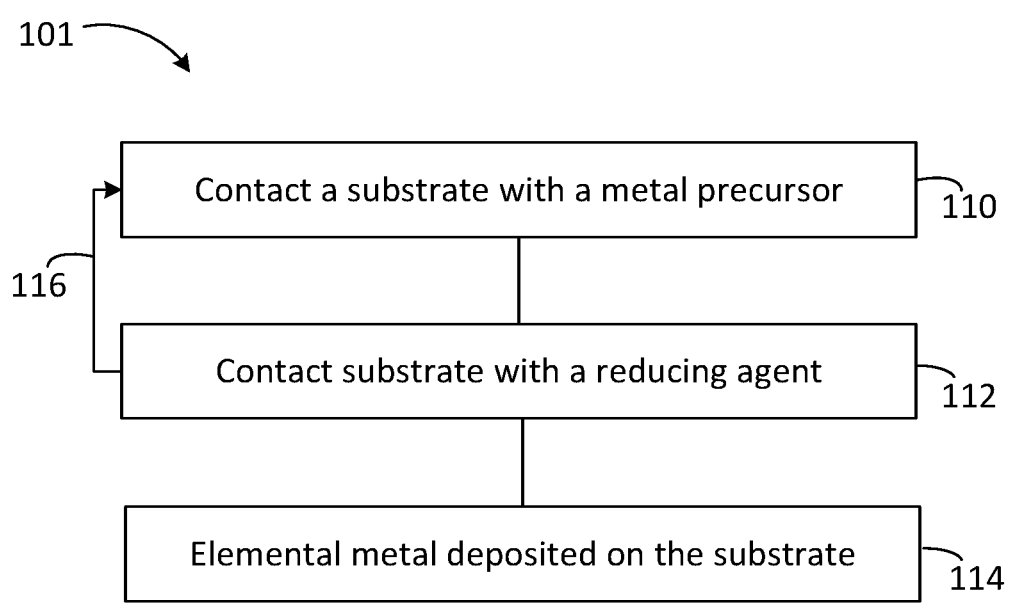

FIG. 1 is a block diagram of an exemplary embodiment of a method 100.

In the first phase 102, a substrate is provided into a reaction chamber. A substrate according to the current disclosure may comprise, for example, an oxide, such as silicon oxide (for example thermal silicon oxide or native silicon oxide), aluminum oxide, or a transition metal oxide, such as hafnium oxide. A substrate may comprise a nitride, such as silicon nitride or titanium nitride, a metal, such as copper, cobalt or tungsten, chalcogenide material, such as molybdenum sulfide. The elemental metal or semimetal-containing material according to the current disclosure may be deposited on said surfaces. The deposited material may form layers that can be used in the manufacture of electronic devices. Depending on the application in question, the layer properties may differ. For example, layers of different thicknesses may be deposited. Also, the elemental metal or semimetal-containing material may me doped with another material, either a metal, semimetal or a non-metal to amend its properties.

The reaction chamber can form part of an atomic layer deposition (ALD) assembly. The reaction chamber can form part of a chemical vapor deposition (CVD) assembly. The assembly may be a single wafer reactor. Alternatively, the reactor may be a batch reactor. The assembly may comprise one or more multi-station deposition chambers. Various phases of method 100 can be performed within a single reaction chamber or they can be performed in multiple reaction chambers, such as reaction chambers of a cluster tool. In some embodiments, the method 100 is performed in a single reaction chamber of a cluster tool, but other, preceding or subsequent, manufacturing steps of the structure or device are performed in additional reaction chambers of the same cluster tool. Optionally, an assembly including the reaction chamber can be provided with a heater to activate the reactions by elevating the temperature of one or more of the substrate and/or the reactants and/or precursors. The metal or semimetal-containing material according to the current disclosure may be deposited in a cross-flow reaction chamber. The metal or semimetal-containing material according to the current disclosure may be deposited in a cross-flow reaction chamber.

A metal precursor or a semimetal precursor is provided in the reaction chamber containing the substrate at phase 104. Without limiting the current disclosure to any specific theory, metal or semimetal precursor may chemisorb on the substrate during providing metal or semimetal precursor into the reaction chamber. The duration of providing metal or semimetal precursor into the reaction chamber (metal or semimetal precursor pulse time) may be, for example, from about 0.1 to about 15 seconds, from about 0.5 to about 10 seconds, from about 0.5 to about 5 seconds, or from about 0.5 to about 3 seconds. For example, the metal or semimetal pulse time may be about 0.5 seconds, 1 second, 1.5 seconds, 2 seconds, 3 seconds, 3.5 seconds, 5 seconds, 7 seconds, or 10 seconds. In some embodiments, the metal or semimetal precursor pulse time may be shorter than 25 s, shorter than 15 s, shorter than 8 s, shorter than 5 s, or shorter than 2 s. The duration depends on the precursor used, and on the application, for example. In some embodiments, a saturating pulsing is used. In some embodiments, a non-saturating pulsing regime is used.

When reducing agent is provided in the reaction chamber at phase 106, it may react with the chemisorbed metal precursor or semimetal precursor, or its derivate species, to form elemental metal or semimetal. The duration of providing reducing agent in the reaction chamber (reducing agent pulse time) may be, for example from about 0.1 to about 15 seconds, from about 0.5 to about 10 seconds, from about 0.5 to about 5 seconds, or from about 0.5 to about 3 seconds. For example, the metal or semimetal pulse time may be about 0.5 seconds, 1 second, 1.5 seconds, 2 seconds, 3 seconds, 3.5 seconds, 5 seconds, 7 seconds, or 10 seconds. The duration depends on the reducing agent, the metal or semimetal precursor used, and on the application, for example. In some embodiments, the reducing agent pulse time may be shorter than 25 s, shorter than 15 s, shorter than 8 s, shorter than 5 s, or shorter than 2 s.

In some embodiments, metal or semimetal precursor is heated before providing it into the reaction chamber. In some embodiments, reducing agent is heated before providing it to the reaction chamber. In some embodiments, the metal or semimetal precursor is kept in ambient temperature before providing it to the reaction chamber. In some embodiments, the reducing agent is kept in ambient temperature before providing it to the reaction chamber.

Phases 104 and 106, performed in any order, may form a deposition cycle, resulting in the deposition of elemental metal or semimetal-containing material on the substrate surface. In some embodiments, the two phases of elemental metal or semimetal-containing material deposition, namely providing the metal or semimetal precursor and the reducing agent in the reaction chamber (104 and 106), may be repeated (loop 108). Such embodiments contain several deposition cycles. The thickness of the deposited metal or semimetal-containing material may be regulated by adjusting the number of deposition cycles. The deposition cycle (loop 108) may be repeated until a desired transition metal or semimetal-containing material thickness is achieved. For example, about 50, 100, 200, 300, 400, 500, 700, 800, 1,000, 1,200, 1,500 or 2,000 deposition cycles may be performed.

Panel 1B illustrates a similar deposition process as described above. In panel 1B, the process comprises purging the reaction chamber after providing a metal or semimetal precursor in the reaction chamber 105, and after providing a reducing agent in the reaction chamber 107. However, in some embodiments, only one of the purge phases 105 and 107 is performed. In some embodiments, both purge phases 105 and 107 are performed. The duration of the purge phase 105 and 107 may be the same or different. The selection of an appropriate purge phase length depends on the precursor and reducing agent properties, as well as on the substrate topology, as well as on other parameters of the deposition process.

Panel 1C illustrates an aspect of the current disclosure in which a method 101 according to the current disclosure comprises contacting a substrate with a vapor-phase metal precursor 110, wherein the metal precursor comprises a metal atom with an oxidation state of +1 or higher. Thereafter, the substrate is contacted with a vapor-phase reducing agent according to the current disclosure 112. This at least partially reduces the metal atom in the metal precursor to deposit elemental metal on the substrate 114. Although depicted as separate phase 114, the deposition of elemental metal may take place simultaneously with at least one of the other phases 110 and/or 112.

Phases 110 and 112, performed in any order, may form a deposition cycle, resulting in the deposition of elemental metal on the substrate surface. In some embodiments, the two phases of elemental metal deposition, namely contacting the substrate with a metal precursor 110 and contacting the substrate with a reducing agent 112, may be repeated (loop 116). Such embodiments contain several deposition cycles. The thickness of the deposited metal may be regulated by adjusting the number of deposition cycles. The deposition cycle (loop 116) may be repeated until a desired metal thickness is achieved. For example, about 50, 100, 200, 300, 400, 500, 700, 800, 1,000, 1,200, 1,500 or 2,000 deposition cycles may be performed.

Although Panel 1C illustrates an aspect of the current disclosure in which elemental metal is deposited on a substrate, alternatively, elemental semimetal may be deposited similarly. Thus, a method according to the current disclosure may comprise contacting a substrate with a vapor-phase semimetal precursor, wherein the semimetal precursor comprises a semimetal atom with an oxidation state of +1 or higher. Thereafter, the substrate is contacted with a vapor-phase reducing agent according to the current disclosure. This at least partially reduces the semimetal atom in the semimetal precursor to deposit elemental semimetal on the substrate. Although depicted as separate phase, the deposition of elemental semimetal may take place simultaneously with at least one of the other phases.

Phases of contacting a substrate with a vapor-phase semimetal precursor and contacting the substrate with a vapor-phase reducing agent performed in any order, may form a deposition cycle, resulting in the deposition of elemental semimetal on the substrate surface. In some embodiments, the two phases of elemental semimetal deposition, namely contacting the substrate with a semimetal precursor and contacting the substrate with a reducing agent, may be repeated. Such embodiments contain several deposition cycles. The thickness of the deposited semimetal may be regulated by adjusting the number of deposition cycles. The deposition cycle may be repeated until a desired semimetal thickness is achieved. For example, about 50, 100, 200, 300, 400, 500, 700, 800, 1,000, 1,200, 1,500 or 2,000 deposition cycles may be performed.

Figure 2:
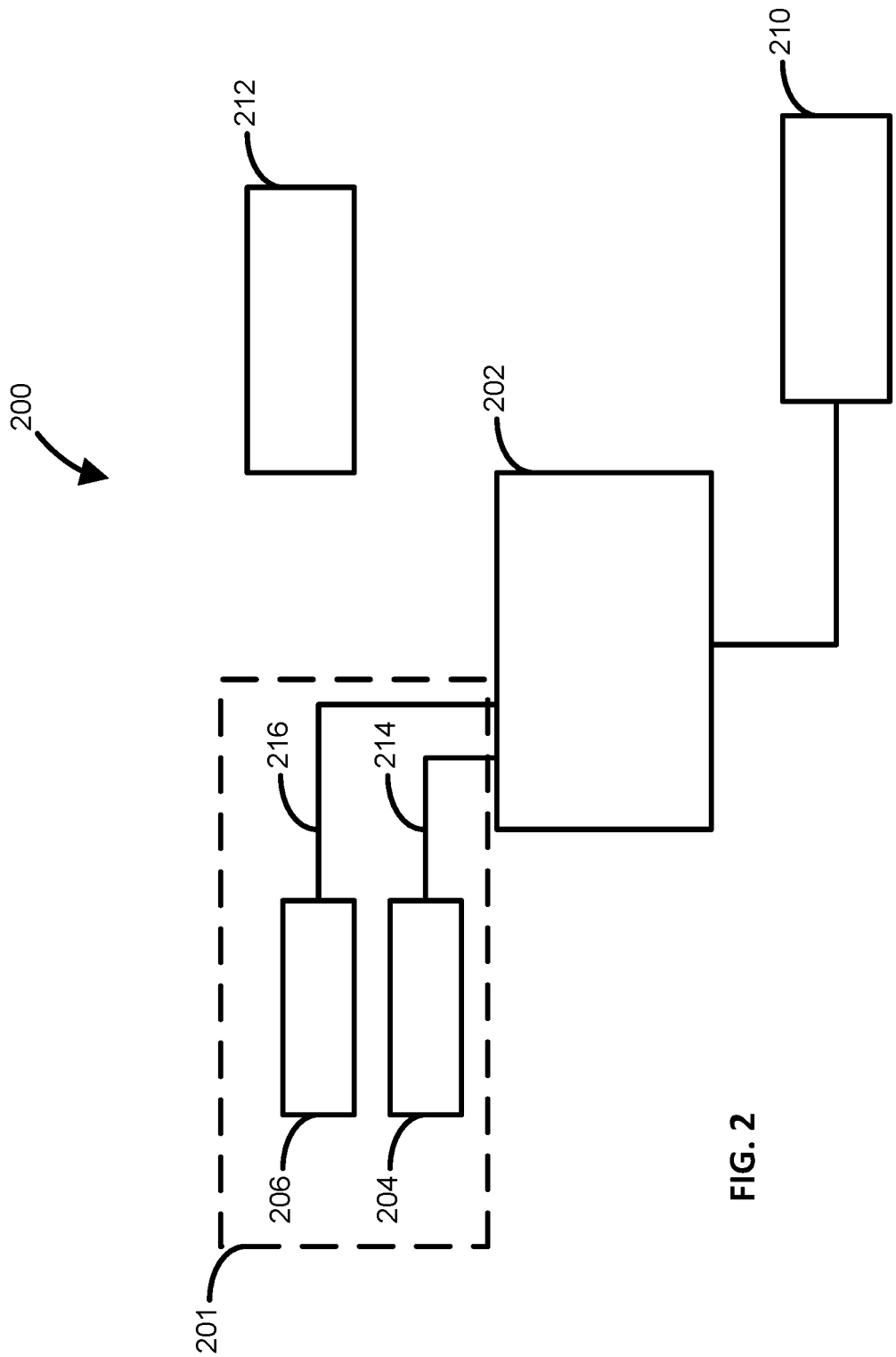
FIG. 2 is a schematic presentation of a deposition assembly according to the current disclosure.

FIG. 2 illustrates a deposition assembly 200 according to the current disclosure in a schematic manner. Deposition assembly 200 can be used to perform a method as described herein and/or to form a layer, a structure or a device, or a portion thereof as described herein.

In the illustrated example, deposition assembly 200 includes one or more reaction chambers 202, a precursor injector system 201, a metal or semimetal precursor vessel 204, a reducing agent vessel 206, an exhaust source 210, and a controller 212. The deposition assembly 200 may comprise one or more additional gas sources (not shown), such as an inert gas source, a carrier gas source and/or a purge gas source. Also, in case materials comprising additional elements are deposited, the deposition assembly may further comprise additional precursor and/or reactant vessels.

Reaction chamber 202 can include any suitable reaction chamber, such as an ALD or CVD reaction chamber as described herein.

The metal or semimetal precursor vessel 204 can include a vessel and one or more metal or semimetal precursors as described herein—alone or mixed with one or more carrier (e.g., inert) gases. A reducing agent vessel 206 can include a vessel and a reducing agent as described herein—alone or mixed with one or more carrier gases. Although illustrated with two source vessels 204 and 206, deposition assembly 200 can include any suitable number of source vessels. Source vessels 204 and 206 can be coupled to reaction chamber 202 via lines 214 and 216, which can each include flow controllers, valves, heaters, and the like. In some embodiments, the metal or semimetal precursor in the metal or semimetal precursor vessel 204 and/or the reducing agent in the reducing agent vessel 206 may be heated. In some embodiments, the temperature of the reducing agent vessel is regulated so that it is between X ° C. and about Y ° C. In some embodiments, the temperature of the reducing agent vessel is regulated so that it is between X ° C. and about Y ° C.

Exhaust source 210 can include one or more vacuum pumps.

Controller 212 includes electronic circuitry and software to selectively operate valves, manifolds, heaters, pumps and other components included in the deposition assembly 200. Such circuitry and components operate to introduce precursors, reactants and purge gases from the respective sources. Controller 212 can control timing of gas pulse sequences, temperature of the substrate and/or reaction chamber 202, pressure within the reaction chamber 202, and various other operations to provide proper operation of the deposition assembly 200. Controller 212 can include control software to electrically or pneumatically control valves to control flow of precursors, reactants and purge gases into and out of the reaction chamber 202. Controller 212 can include modules such as a software or hardware component, which performs certain tasks. A module may be configured to reside on the addressable storage medium of the control system and be configured to execute one or more processes.

Other configurations of deposition assembly 200 are possible, including different numbers and kinds of precursor and reactant sources. Further, it will be appreciated that there are many arrangements of valves, conduits, precursor sources, and auxiliary reactant sources that may be used to accomplish the goal of selectively and in coordinated manner feeding gases into reaction chamber 202. Further, as a schematic representation of a deposition assembly, many components have been omitted for simplicity of illustration, and such components may include, for example, various valves, manifolds, purifiers, heaters, containers, vents, and/or bypasses.

During operation of deposition assembly 200, substrates, such as semiconductor wafers (not illustrated), are transferred from, e.g., a substrate handling system to reaction chamber 202. Once substrate(s) are transferred to reaction chamber 202, one or more gases from gas sources, such as precursors, reactants, reducing agents, carrier gases, and/or purge gases, are introduced into reaction chamber 202.

In some embodiments, a metal or semimetal precursor is supplied in pulses, a reducing agent is supplied in pulses and the reaction chamber is purged between consecutive pulses of metal or semimetal precursor and a reducing agent.

EXAMPLES

Example 1: Deposition of Elemental Nickel

In an exemplary deposition process, elemental (i.e. metallic) nickel was deposited using dichloro-bis(triethylphosphine)nickel as a metal precursor and 1,4-bis(trimethylgermyl)-1,4-dihydropyrazine (GeDHP) as the reducing agent. In the example, the reducing agent was able to reduce nickel into elemental metal. In the example, a flow-type (i.e. cross-flow) ALD reactor was used. The pressure inside the reactor was from about 0.5 Torr to about 10 Torr during the process. The deposition process was performed at a temperature from about 95° C. to about 135° C., such as at from about 100° C. to about 130° C. In an exemplary deposition process, a temperature of 110° C. was used. The nickel precursor was provided in the reaction chamber (i.e. pulsed) from about 0.5 seconds to about 2 seconds, such as for about 1 second. The reducing agent may be provided into the reaction chamber for about 0.5 seconds to about 3 seconds, such as for 1.5 about seconds. The process comprised a purge phase after each precursor pulsing phase.

$N_2$ (5.0) was used as a carrier gas and as a purge gas. The nickel precursor was vaporized at a temperature of 100° C., and the reducing agent was vaporized at a temperature of 35° C. Deposition was performed on soda lime glass, on silicon substrates with a native oxide layer, on copper and on titanium nitride. The growth rate of the elemental metal-containing material, which in this case is comprised substantially only elemental nickel, was approximately 0.2 Å/cycle. The growth rate of the material may decrease after the deposited material forms a substantially pinhole-free layer. As a non-limiting example, the growth rate may decrease to approximately 0.1 Å/cycle. Nickel metal-containing layers may be obtained by the process, and the thickness of the layer depends on the number of pulsing cycles. For example, layers having thickness of at least 15 nm, such as at least 20 nm may be obtained.

In the exemplary process, the deposited metal-containing material comprised cubic nickel metal, as analyzed via XRD measurements. The resistivity of the nickel-containing layers was approximately 40 μΩ cm. A conductive layer could be achieved at a layer thickness of about 7.7 nm and the layers were mostly pinhole-free when they exceeded 20 nm in thickness. Based on SEM imaging, the grain size was deemed small, and the layers to be relatively smooth.

The deposited metal-containing material comprised about 87 at. % nickel, and about 7 at. % carbon. Raman spectroscopy indicated that all of the carbon in the layers was carbidic. There were only small amounts of other elements. Chlorine content of the material was less than 0.2 at. %, indicating efficient reduction. Most of the oxygen was only present on the material surface, most likely due to post-deposition exposure to ambient atmosphere and the resulting oxidation of Ni metal surface.

Example 2: Deposition of Elemental Cobalt

In another set of experiments, elemental cobalt was deposited using metal precursors comprising cobalt halide with diamine adduct ligands and a reducing agent according to the current disclosure. Elemental cobalt was successfully deposited using $CoBr_2$(N,N,N',N'-tetramethyl-1,2-ethylenediamine) [$CoBr_2$(tmeda)], $CoBr_2$(N,N,N',N'-tetramethyl-1,3-propanediamine) [$CoBr_2$(tmpda)], $CoCl_2$(N,N,N',N'-tetramethyl-1,3-propanediamine) [$CoCl_2$(tmpda)] and $CoI_2$(N,N,N',N'-tetramethyl-1,3-propanediamine) [$CoI_2$(tmpda)]. GeDHP was used as a reducing agent, and deposition was performed at temperatures varying from 180° C. to 240° C. Material deposited using $CoBr_2$(tmeda) and GeDHP was studied for an initial understanding of material properties. It was observed that an increase in temperature increased the deposition rate of the material, which varied from about 0.2 Å/cycle to about 0.35 Å/cycle. The resistivity of layers deposited also increased at higher deposition temperatures, and ranged from about 60 μΩ cm to about 120 μΩ cm. Even without process optimization, cobalt constituted about 80 at. % of the material, carbon less than 13 at. %, nitrogen less than 2.5 at. %, and Ge and Br combined less than 3.5 at. %.

Example 3: Deposition of Elemental Gold

In a further exemplary deposition process, elemental (i.e. metallic) gold was deposited using triethylphosphinogold(I) chloride (AuCl(TEP)) as the transition metal precursor and 1,4-bis(trimethylgermyl)-1,4-dihydropyrazine (DHPGE) as the second precursor, as above, using a flow-type ALD reactor and a pressure of below 10 Torr. The deposition process was performed multiple times at a temperatures from about 160° C. to about 180° C., the higher deposition temperature increasing the growth rate of the layer significantly. The transition metal precursor was provided in the reaction chamber (i.e. pulsed) from about 1 second to about 6 seconds, such as for about 3 or 4 seconds. The second precursor may be provided into the reaction chamber for about 0.2 seconds to about 3 seconds, such as for about 0.5 seconds. The process comprised a purge phase after each precursor pulsing phase similarly to above.

The transition metal precursor was vaporized at a temperature of 160° C., and the second precursor was vaporized at a temperature of 45° C. Deposition was performed on soda lime glass and on silicon substrates with a native oxide layer. The growth rate of the transition metal-containing material, which in this case is comprised substantially only elemental gold, was from about 1 Å/cycle to about 3.2 Å/cycle. Gold metal-containing layers may be obtained by the process, and the thickness of the layer depends on the number of pulsing cycles. For example, layers having thickness of at least about 50 nm, such as at least about 60 nm, 110 nm or at least about 135 nm may be obtained. The resistivity of the gold-containing layers was measured to be below 2.5 μΩ cm, such as about 2.44 μΩ cm, indicating very pure elemental gold material.

Example 4: Synthesis of GeDHP

GeDHP was synthesized by weighing lithium granules into a Schlenk bottle, adding THF and cooling the reaction vessel to −15° C. Magnetic stirring was applied. $(CH_3)_3$GeCl and pyrazine, in 2:1 molar ratio, dissolved in tetrahydrofuran, were added to this mixture slowly through a dropping funnel. Solution was let to stir for overnight at −15° C., after which the unreacted lithium was filtered off. The filtrate was evaporated to dryness and the resulting material was sublimed at about 80-100° C. under a pressure of 0.05 mbar. The yield of the process was about 86% of the theoretical yield.

$(CH_3)_3$GeCl used in the process was synthesized through a high-pressure synthesis route from $GeCl_4$ and $Me_4Si$, with $AlBr_3$ as a catalyst. $GeCl_4$ and $Me_4Si$ were added into an autoclave in 1:2 molar ratio, together with $AlBr_3$. The reaction mixture was mixed for 18 hours at 200° C. and the product was distilled from the mixture at a temperature of from about 53° C. to about 62° C. under a pressure of 140 mmHg. The yield was about 80% of the theoretical yield.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of depositing elemental metal or semimetal-containing material on a substrate by a cyclic deposition process, the method comprising:
   providing a substrate in a reaction chamber;
   providing a metal or a semimetal precursor to the reaction chamber in a vapor phase; and
   providing a reducing agent into the reaction chamber in a vapor phase to form elemental metal or semimetal-containing material on the substrate,
   wherein the reducing agent comprises a cyclohexadiene compound selected from compounds of formula (I),

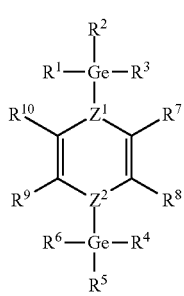

(I)

wherein each of $Z^1$ and $Z^2$ is independently selected from a group consisting of $CR^{11}$ and N, and wherein each of $R^1$ to $R^{11}$ is independently selected from a group consisting of H, C1 to C7 linear or branched alkyl, C6 to C10 aryl and C6 to C14 heteroaryl.

2. The method of claim 1, wherein $R^{11}$ is H.
3. The method of claim 1, wherein $Z^1$ and $Z^2$ are N.
4. The method of claim 1, wherein each of $R^7$ to $R^{10}$ is independently selected from a group consisting of H, C1 to C4 linear or branched alkyl and phenyl.
5. The method of claim 1, wherein all of $R^7$ to $R^{10}$ are H.
6. The method of claim 1, wherein each of R1 to R6 is independently selected from a group consisting of H, methyl, ethyl, n-propyl and isopropyl.
7. The method of claim 1, wherein all of R1 to R6 are methyl or ethyl.
8. The method of claim 1, wherein the cyclohexadiene compound is 1,4-bis(trimethylgermyl)-1,4-dihydropyrazine.
9. The method of claim 1, wherein the metal or semimetal precursor is a metal precursor and elemental metal is deposited on the substrate.
10. The method of claim 9, wherein the metal precursor comprises a metal halide.
11. The method of claim 10, wherein the metal halide is selected from a group consisting of $CoCl_2$, $NiCl_2$, $CuCl_2$, $ZnCl_2$, $CoBr_2$, $NiBr_2$, $CuBr_2$, $ZnBr_2$, $CoI_2$, $NiI_2$, $CuI_2$ and $ZnI_2$.
12. The method of claim 10, wherein the metal precursor comprises an adduct ligand.
13. The method of claim 12, wherein the adduct ligand is a monodentate adduct ligand.
14. The method of claim 1, wherein the metal or semimetal precursor is a transition metal precursor and elemental transition metal is deposited on the substrate.
15. The method of claim 14, wherein the elemental transition metal is a row 4 transition metal.
16. The method of claim 15, wherein the row 4 transition metal is selected from a group consisting of Co, Ni, Cu and Zn.
17. The method of claim 1, wherein the metal or semimetal precursor comprises a metal or semimetal atom in a formal oxidation state of +1, +2, +3 or +4.
18. The method of claim 1, wherein at least one of $Z^1$ and $Z^2$ is $CR^{11}$.
19. A method of depositing a metal layer on a substrate, the method comprising:
   contacting the substrate with a vapor-phase metal precursor, wherein the metal precursor comprises a metal atom with an oxidation state of +1 or higher; and
   contacting the substrate with a vapor-phase reducing agent to reduce the metal atom in the metal precursor to form a metal layer on the substrate,
   wherein the reducing agent comprises a cyclohexadiene compound selected from compounds of formula (I),

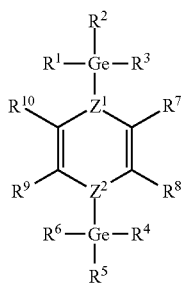

(I)

wherein each of $Z^1$ and $Z^2$ is independently selected from a group consisting of $CR^{11}$ and N, and wherein each of $R^1$ to $R^{11}$ is independently selected from a group consisting of H, C1 to C7 linear or branched alkyl, C6 to C10 aryl or C6 to C14 heteroaryl.

* * * * *